United States Patent
Brukiewa et al.

(10) Patent No.: US 10,931,241 B2
(45) Date of Patent: Feb. 23, 2021

(54) MODEL-FREE SAMPLE-BASED APPROACHES FOR POWER AMPLIFIER LINEARIZATION IN REAL-TIME

(71) Applicant: Raytheon Company, Waltham, MA (US)

(72) Inventors: Thomas F. Brukiewa, West Hills, CA (US); Jonathan K. Lau, La Palma, CA (US); Brandon H. Daugherty, Melissa, TX (US); Daniel B. Kilfoyle, Falmouth, MA (US)

(73) Assignee: Raytheon Company, Waltham, MA (US)

( * ) Notice: Subject to any disclaimer, the term of this patent is extended or adjusted under 35 U.S.C. 154(b) by 72 days.

(21) Appl. No.: 16/269,295

(22) Filed: Feb. 6, 2019

(65) Prior Publication Data
US 2020/0252031 A1    Aug. 6, 2020

(51) Int. Cl.
*H03F 1/32* (2006.01)
*H03F 3/24* (2006.01)
*H04B 1/04* (2006.01)

(52) U.S. Cl.
CPC ......... *H03F 1/3247* (2013.01); *H03F 1/3223* (2013.01); *H03F 3/24* (2013.01)

(58) Field of Classification Search
CPC ........ H03F 1/3247; H03F 1/3223; H03F 3/24; H03F 2201/3233; H03F 2200/451; H03F 3/189; H04B 2001/0425; H04B 1/0475
USPC .................................. 330/149; 375/296–297
See application file for complete search history.

(56) References Cited

U.S. PATENT DOCUMENTS

| | | |
|---|---|---|
| 6,198,416 B1 | 3/2001 | Velazquez |
| 6,424,275 B1 | 7/2002 | Velazquez |
| 6,570,514 B1 | 5/2003 | Velazquez |
| 6,798,843 B1 * | 9/2004 | Wright .................. H03F 1/3241 330/149 |
| 7,782,235 B1 | 8/2010 | Velazquez |
| 8,164,496 B2 | 4/2012 | Velazquez |

(Continued)

FOREIGN PATENT DOCUMENTS

EP    2824833 A1    1/2015

OTHER PUBLICATIONS

Collins, "All Programmable RF-Sampling Solutions," White Paper: Direct RF-Sampling, WP489 (v.1.0.1), Xilinx, Inc., Apr. 2017, 10 pages.

(Continued)

*Primary Examiner* — Hieu P Nguyen (57) ABSTRACT

An apparatus includes at least one processing device configured to obtain samples of an input signal to be amplified and, in real-time, pre-distort at least some of the samples using pre-distortion values from at least one lookup table. The pre-distorted samples are to be converted into an analog signal that is amplified by at least one power amplifier. The pre-distortion values at least partially compensate for a non-linear operation of the at least one power amplifier. The at least one processing device is also configured to compare an output signal generated by the at least one power amplifier to an expected signal to identify errors between the output and expected signals. The at least one processing device is further configured to update one or more pre-distortion values in the at least one lookup table based on the identified errors.

21 Claims, 6 Drawing Sheets

(56) References Cited

U.S. PATENT DOCUMENTS

| | | |
|---|---|---|
| 8,441,322 B1 | 5/2013 | White |
| 8,582,694 B2 | 11/2013 | Velazquez et al. |
| 8,687,733 B1 | 4/2014 | Gheitanchi et al. |
| 9,160,310 B2 | 10/2015 | Velazquez et al. |
| 9,705,477 B2 | 7/2017 | Velazquez |
| 2001/0033238 A1 | 10/2001 | Velazquez |
| 2002/0121993 A1 | 9/2002 | Velazquez |
| 2011/0095819 A1 | 4/2011 | Velazquez |
| 2011/0175678 A1 | 7/2011 | Velazquez |
| 2013/0016798 A1 | 1/2013 | Velazquez et al. |
| 2014/0133603 A1 | 5/2014 | Velazquez et al. |
| 2015/0032788 A1 | 1/2015 | Velazquez et al. |
| 2015/0055731 A1 | 2/2015 | Harris et al. |
| 2016/0191020 A1 | 6/2016 | Velazquez |

OTHER PUBLICATIONS

"Zynq UltraScale+ RFSoC Data Sheet: Overview," Advance Product Specification, DS889 (v.1.6), Xilinx, Inc., Nov. 2018, 33 pages.

"UltraScale Architecture and Product Data Sheet: Overview," Product Specification, DS890 (v.3.6), Xilinx, Inc., Nov. 2018, 46 pages.

Vaz et al., "A 13b 4GS/s Digitally Assisted Dynamic 3-Stage Asynchronous Pipelined-SAR ADC," 2017 IEEE International Solid-State Circuits Conference, 2017, 6 pages.

Turker et al., "A 7.4-to-14GHz PLL with 54fs_rms Jitter in 16nm FinFET for Integrated RF-Data-Converter SoCs," 2018 IEEE International Solid-State Circuits Conference, 2018, 2 pages.

International Search Report and Written Opinion of the International Searching Authority in connection with International Patent Application No. PCT/US2019/049303 dated Dec. 5, 2019, 12 pages.

\* cited by examiner

MODEL-FREE SAMPLE-BASED APPROACHES FOR POWER AMPLIFIER LINEARIZATION IN REAL-TIME

TECHNICAL FIELD

This disclosure relates generally to power amplification systems. More specifically, this disclosure relates to model-free sample-based approaches for power amplifier linearization in real-time.

BACKGROUND

Numerous communication systems use power amplifiers to amplify radio frequency (RF) signals or other signals for transmission. In some systems, power amplifiers may be used to generate high-power wireless signals for transmission. In order to achieve high output powers with high efficiencies, it may be necessary or desirable to operate power amplifiers into their saturation regions. The saturation region of a power amplifier refers to an operating range in which the power amplifier operates non-linearly, meaning the output of the power amplifier varies non-linearly with respect to its input. Unfortunately, the resulting non-linearity may produce intermodulation products and harmonics in the power amplifier's output, which can interfere with the operation of the power amplifier or a larger system that includes the power amplifier.

SUMMARY

This disclosure provides model-free sample-based approaches for power amplifier linearization in real-time.

In a first embodiment, a method includes obtaining samples of an input signal to be amplified and, in real-time, pre-distorting at least some of the samples using pre-distortion values from at least one lookup table. The pre-distorted samples are to be converted into an analog signal that is amplified by at least one power amplifier. The pre-distortion values at least partially compensate for a non-linear operation of the at least one power amplifier. The method also includes comparing an output signal generated by the at least one power amplifier to an expected signal to identify errors between the output and expected signals. In addition, the method includes updating one or more pre-distortion values in the at least one lookup table based on the identified errors.

In a second embodiment, an apparatus includes at least one processing device configured to obtain samples of an input signal to be amplified and, in real-time, pre-distort at least some of the samples using pre-distortion values from at least one lookup table. The pre-distorted samples are to be converted into an analog signal that is amplified by at least one power amplifier. The pre-distortion values at least partially compensate for a non-linear operation of the at least one power amplifier. The at least one processing device is also configured to compare an output signal generated by the at least one power amplifier to an expected signal to identify errors between the output and expected signals. The at least one processing device is further configured to update one or more pre-distortion values in the at least one lookup table based on the identified errors.

In a third embodiment, a system includes a field programmable gate array configured to obtain samples of an input signal to be amplified and, in real-time, pre-distort at least some of the samples using pre-distortion values from at least one lookup table. The system also includes a digital-to-analog converter configured to convert the pre-distorted samples into an analog signal. The system further includes at least one power amplifier configured to amplify the analog signal, where the pre-distortion values at least partially compensate for a non-linear operation of the at least one power amplifier. The field programmable gate array or a processing device is configured to compare an output signal generated by the at least one power amplifier to an expected signal to identify errors between the output and expected signals and update one or more pre-distortion values in the at least one lookup table based on the identified errors.

In some embodiments, the at least one lookup table contains one-to-one or many-to-one mappings of one or more characteristics of input signal samples to pre-distortion values.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 6, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, high-power amplifiers can be used to generate high-power radio frequency (RF) signals or other signals for transmission. In order to achieve high output powers with high efficiencies, it may be necessary or desirable to operate these power amplifiers into their saturation regions. Unfortunately, the resulting non-linear operations can lead to the production of intermodulation products and harmonics that can interfere with operation of the power amplifiers or larger systems. As a specific example of this, gallium nitride (GaN) power amplifiers can produce intermodulation products due to their inherent non-linear amplifier characteristics at high output powers. In order to reduce or avoid this, the output power often needs to be reduced (sometimes significantly). However, reducing the output power can prevent the power amplifiers or the overall systems from achieving the desired output power levels.

This disclosure describes various model-free sample-based approaches for power amplifier linearization in real-time. In these approaches, techniques are used to modify or pre-distort an input signal being provided to a power amplifier so that the power amplifier generates an output signal and at least appears to operate linearly. This pre-distortion is achieved using a lookup table, where the lookup table contains pre-distortion values that are applied to samples of the input signal prior to amplification by the power amplifier. This pre-distortion can help to significantly reduce the production of intermodulation products and harmonics by the power amplifier. Moreover, these approaches can be performed in real-time, such as by using one or more field programmable gate arrays (FPGAs) or other suitable circuitry to apply the pre-distortion values to the input signal. Further, these approaches can operate iteratively and dynamically, such as when the pre-distortion values in the lookup table are updated over time. For instance, a desired linear signal can be compared to the output of the power amplifier after the pre-distortion has been applied, allowing the pre-distortion values in the lookup table to be modified in order to more closely match subsequent outputs of the power amplifier to desired linear signals.

While various theoretical approaches have been developed for power amplifier linearization, these theoretical approaches are typically directed towards specific types of input signals (such as input signals having specific types of waveforms) that are bandwidth-limited. Other approaches for power amplifier linearization have involved the use of Volterra filters, which are highly complex and often difficult to implement in a computationally-efficient manner. The approaches described in this patent document can be used with arbitrary and changing waveforms and with wide bandwidths, thereby supporting real-time adaptive linearization. Also, the approaches described here can be used to help compensate for changes to power amplifier characteristics that alter the non-linear behaviors of the power amplifier. In addition, the approaches described here can be less complex, less computationally difficult, and easier to implement practically compared to other approaches.

The approaches described in this patent document can be used to support any suitable functionality in various types of systems. For example, electronic warfare (EW) generally refers to any action that is designed to interfere with an opponent's use of at least part of an electromagnetic spectrum (often while ensuring friendly unimpeded use of the same part of the electromagnetic spectrum). Electronic warfare can take various forms, such as interfering with or jamming an opponent's radar or communication systems or preventing an opponent's systems from receiving navigation signals. In the electronic warfare environment, the selection of the signals to be transmitted by an electronic warfare system can be driven (among other things) by the target to be interfered with, so the waveforms and bandwidths of the signals to be transmitted can vary greatly. As a result, any linearization approach used in an electronic warfare system typically needs to be very responsive, support a widely-diverse waveform set, and have an exceptionally wide bandwidth. The approaches described in this patent document can support this functionality. As another example, long-range communication systems or other high-power communication systems can use the approaches described in this patent document to support high-power amplification of RF, microwave, or other signals to be transmitted. As a specific example, the approaches described in this patent document can be used in so-called "5G" wireless communication systems and other communication systems to achieve a linear response in an amplifier. The linearization of amplifiers can support 5G and other communications in various ways. For instance, many digital waveform coding techniques (such as orthogonal frequency-division multiplexing or "OFDM") require linearity to work correctly. Also, linearization of an amplifier can help to inhibit a signal from spreading into and interfering with adjacent channels.

Figure 1:
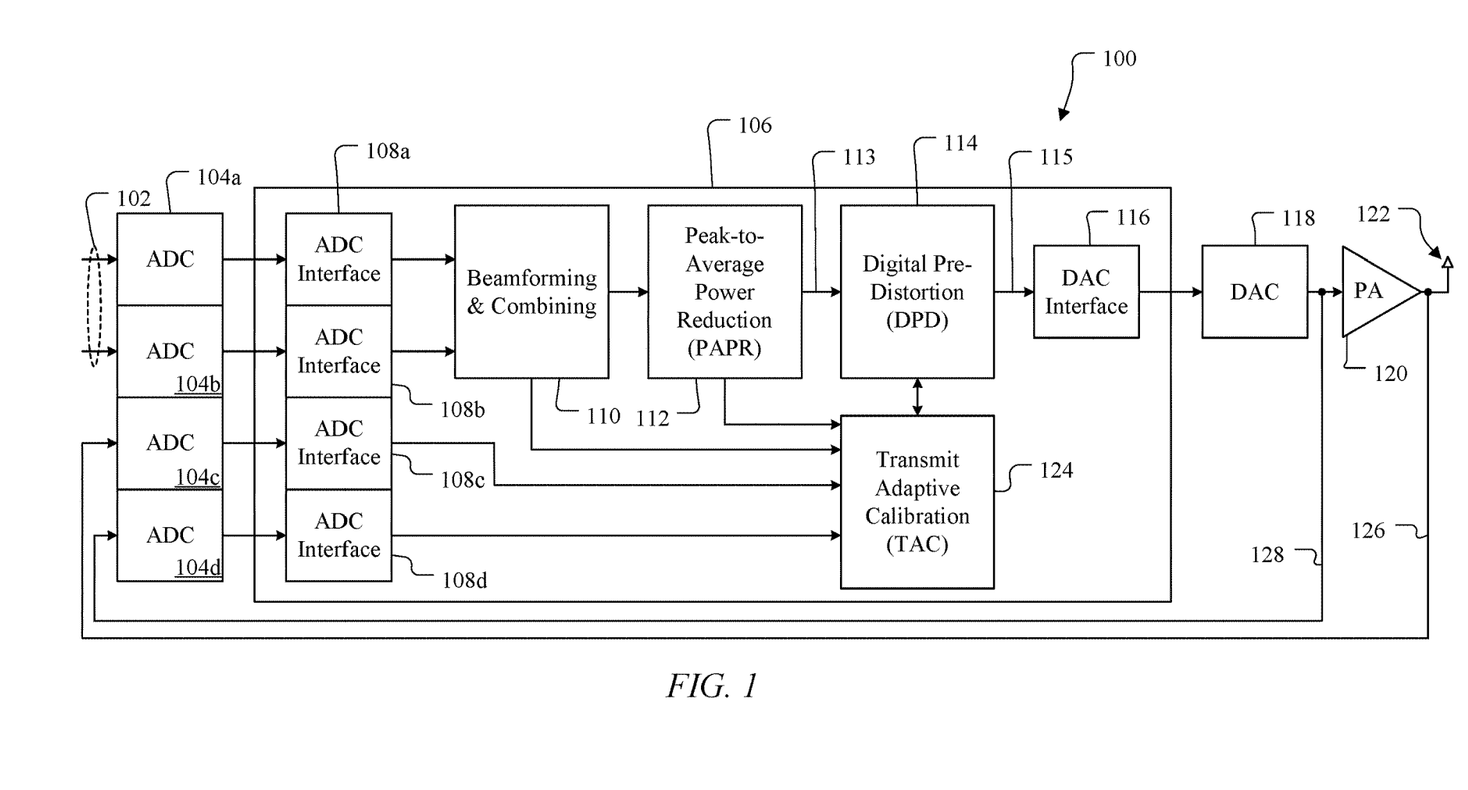
FIG. 1 illustrates an example system supporting a model-free sample-based approach for power amplifier linearization in real-time in accordance with this disclosure.

FIG. 1 illustrates an example system 100 supporting a model-free sample-based approach for power amplifier linearization in real-time in accordance with this disclosure. In particular, FIG. 1 illustrates an example system 100 in which one signal to be transmitted can be pre-distorted in real-time using an adaptive model-free sample-based approach in order to provide power amplifier linearization. As described in more detail below, the same type of approach can also be extended and used to pre-distort multiple signals to be transmitted.

As shown in FIG. 1, the system 100 receives a signal 102 to be amplified and transmitted. The signal 102 generally contains data or otherwise represents an RF or other signal to be transmitted by the system 100. The signal 102 can be received from any suitable source, such as one or more processors. The processors can be used to support any suitable functions, such as long-distance communications, electronic warfare, or other functions. In this example, the signal 102 represents a pair of signals that are combined to produce a single output signal to be amplified and transmitted, although other implementations of the system 100 can be used. For instance, the system 100 may be configured to receive a single signal 102 to be transmitted without combination with other signals.

The system 100 includes multiple analog-to-digital converters (ADCs) 104a-104d, each of which converts an analog signal into corresponding digital values. For instance, at least one of the ADCs 104a-104d in FIG. 1 (such as the ADCs 104a-104b in this example) can receive the signal 102 and convert the signal 102 into digital values. Also, at least one of the ADCs 104a-104d in FIG. 1 (such as the ADCs 104c-104d in this example) can receive at least one feedback signal 126, 128 and convert the feedback signal(s) 126, 128 into digital values. Each ADC 104a-104d includes any suitable structure configured to convert an analog signal into digital values. Note that if the signal 102 represents a single signal, the ADC 104b can be omitted here. Also note that the use of the feedback signal 128 is optional, so the ADC 104d can be omitted here.

The system 100 also includes a real-time processing device 106, such as a field programmable gate array (FPGA). The processing device 106 generally operates to pre-distort a signal prior to power amplification. In this example, the processing device 106 includes multiple ADC interfaces 108a-108d, each of which is configured to receive digital values from a respective ADC 104a-104d. Each ADC interface 108a-108d includes any suitable structure configured to receive digital values. Note that if the signal 102 represents a single signal, the ADC interface 108b can be omitted here. Also note that the use of the feedback signal 128 is optional, so the ADC interface 108d can be omitted here.

A beamforming and combining function 110 of the processing device 106 may operate to determine how to combine multiple signals for transmission, such as by combining the pair of signals forming the signal 102 in this example. The beamforming and combining function 110 may also operate to determine how to weight a signal being transmitted by an antenna 122 in order to achieve a desired directivity in the transmission of the signal (i.e., beamforming). The beamforming and combining function 110 includes any suitable structure configured to combine signals and support beamforming techniques for transmission. Note, however, that if the signal 102 represents a single signal, the combining functionality of the beamforming and combining function 110 may be omitted. Also note that the use of beamforming functionality may not be needed or desired in some embodiments. Thus, one or both of the beamforming and combining functionality can be omitted here.

A peak-to-average power reduction (PAPR) function 112 of the processing device 106 may receive the digitized signal 102 from at least one of the ADC interfaces 108a-108d or the output of the beamforming and combining function 110 (depending on the implementation). Peak-to-average power refers to the ratio between (i) the maximum power used to transmit an outgoing signal and (ii) the average power used to transmit the outgoing signal. In some cases, it may be desirable to hold the peak-to-average power ratio lower in order to reduce peaks in the output power used by at least one power amplifier 120. This can help to reduce error rates or other performance degradations. The PAPR function 112 therefore may generally operate to reduce the peak-to-average power ratio of the signal to be amplified by the power amplifier 120. The PAPR function 112 includes any suitable structure configured to reduce the peak power-to-average power ratio of a signal. The PAPR function 112 can use any suitable technique for peak-to-average power reduction, such as clipping, peak windowing, scrambling, block coding, selected mapping (SLM), and partial transmit sequences (PTS). Note, however, that the use of peak-to-average power reduction is optional in the system 100, so the PAPR function 112 can be omitted here.

A digital pre-distortion (DPD) function 114 of the processing device 106 receives an input signal 113, which may represent the digitized signal 102, the output of the beamforming and combining function 110, or the output of the PAPR function 112 (depending on the implementation). The input signal 113 generally represents the signal to be amplified by the power amplifier 120, and the DPD function 114 generally operates to pre-distort the signal 113 in order to compensate for non-linearity of the power amplifier 120. Ideally, the DPD function 114 performs digital pre-distortion operations so that the subsequent high-power amplification of the signal 113 appears to be linear (or at least substantially more linear compared to operation without pre-distortion), even though the power amplifier 120 may still be operating non-linearly. The DPD function 114 includes any suitable structure configured to pre-distort a signal prior to power amplification. Examples of model-free sample-based approaches for implementing the DPD function 114 in real-time are described below.

A pre-distorted signal 115 to be transmitted is provided via a digital-to-analog converter (DAC) interface 116 of the processing device 106 to a DAC 118. The DAC interface 116 includes any suitable structure configured to provide digital values to a digital-to-analog converter. The DAC 118 includes any suitable structure configured to convert digital values into an analog signal. The analog signal produced by the DAC 118 is provided to the power amplifier 120, which generally operates to increase a power level of the analog signal to be transmitted. The power amplifier 120 provides the amplified analog signal to the antenna 122, which transmits the high-power signal. The power amplifier 120 includes any suitable structure configured to amplify an RF signal or other signal, such as a low-noise amplifier (LNA), a gallium nitride amplifier, a monolithic microwave integrated circuit (MMIC) amplifier, or a transmit integrated MMIC module (TIMMs) containing multiple MIMIC amplifiers. Note that a single power amplifier 120 can be used here, or a chain of multiple power amplifiers 120 can be used sequentially. The antenna 122 includes any suitable antenna element or elements configured to transmit RF, microwave, or other signals.

A small portion of the signal output from the power amplifier 120 is provided as the feedback signal 126 to the ADC 104c, such as via a splitter or other structure, and the ADC 104c generates digital values representing the feedback signal 126. These digital values are provided via the ADC interface 108c to a transmit adaptive calibration (TAC) function 124. Optionally, a small portion of the signal input to the power amplifier 120 is provided as the feedback signal 128 to the ADC 104d, such as via a splitter or other structure, and the ADC 104d generates digital values representing the feedback signal 128. These digital values can also be provided via the ADC interface 108d to the TAC function 124.

The TAC function 124 generally operates to update the DPD function 114 to account for things like inaccurate pre-distortions or characteristic changes of the power amplifier 120. For example, non-linear behavior of the power amplifier 120 can vary based on a number of factors. These factors can include the signal being input to the power amplifier 120 (such as its amplitude or phase) and any coupled signals, the rate of change of the signal (such as its frequency), the history of the signal (referred to as "memory effects"), and physics of the power amplifier material (such as its temperature or age). In some embodiments, the TAC function 124 compares the actual output of the power amplifier 120 (as defined by the feedback signal 126) to an expected output in order to identify where additional pre-distortion may be needed. The expected output may represent any suitable signal, such as the digitized signal 102, the output of the function 110, 112, or 114, or the signal input to the power amplifier 120 (as defined by the feedback signal 128). The TAC function 124 can then update one or more pre-distortion values in a lookup table used by the DPD function 114 to pre-distort subsequent signal values. Ideally, the lookup table becomes more accurate over time and is updated over time to reflect changing characteristics of the power amplifier 120. The TAC function 124 includes any suitable structure configured to provide adaptive functionality for the DPD function 114.

Note that while not shown here, various other components can be included in the system 100 of FIG. 1 to support desired functionality. For example, an RF or other signal distribution network can be used to deliver the signal output from the DAC 118 to at least the power amplifier 120. The distribution network may include one or more attenuators, one or more buffers, or other components used to deliver a signal to the power amplifier 120. The distribution network may also include a splitter or sampler that provides the feedback signal 128. As another example, various filters or other components may be used to process input, intermediate, and/or output signals to remove noise or improve performance of the system 100. In general, any number of additional components may be used in the system 100 to provide desired functionality.

As described in more detail below, the system 100 implements a model-free sample-based approach for power amplifier linearization in real-time. The approach is referred to as "model-free" since the system 100 does not require the use of a mathematical model (or the associated computational complexities) for identifying the pre-distortion values to be used to modify a signal to be transmitted. Instead, the system 100 can use at least one lookup table to identify the pre-distortion values to be used to modify the signal to be transmitted. Also, the approach is referred to as "sample-based" since the system 100 uses sampled values of the signal 102 or 113 in performing the pre-distortion function. In addition, the approach is referred to as "real-time" since the system 100 accesses the lookup table and identifies the pre-distortion values rapidly (as opposed to, for instance, a MATLAB-based tool that executes on a computing workstation). This can be accomplished using an FPGA or other real-time processing device 106. Additional details of example operations performed by the DPD function 114 and the TAC function 124 are provided below.

Each of the functions 110, 112, 114, and 124 shown in FIG. 1 may be implemented in any suitable manner. For example, the functions 110, 112, 114, and 124 may be implemented by suitably configuring an FPGA to perform the functions. As a particular example, the functions 110, 112, 114, and 124 may be implemented using a VIRTEX-7 FPGA from XILINX INC. However, any other suitable FPGA or other real-time processing device 106 can be used here.

As noted above, it is possible for multiple power amplifiers 120 to be used here to amplify the signal 102 or 113. In some embodiments, pre-distortion can be applied to the signal provided to one of the power amplifiers 120 (such as the first power amplifier 120) to compensate for non-linearity of all of the power amplifiers 120. In other embodiments, pre-distortion can be applied to the signals provided to multiple ones of the power amplifiers 120, such as to compensate for non-linearity of different power amplifiers 120 individually. Also, the feedback signal 126 here can represent samples of the output from the last power amplifier 120 and/or samples of one or more signals output from one or more other power amplifiers 120 in the chain. In addition, with the use of multiple power amplifiers 120 having the same design, it may be possible to sample the output of one of the power amplifiers 120 and generate pre-distortion values that are applied to one or more inputs to one or more other power amplifiers 120.

Although FIG. 1 illustrates one example of a system 100 supporting a model-free sample-based approach for power amplifier linearization in real-time, various changes may be made to FIG. 1. For example, various components or functions may be omitted if desired, such as one or more ADCs and corresponding ADC interface(s), the beamforming and combining functionality, and/or the PAPR reduction functionality. Also, the system 100 can be used to process and transmit a single signal or multiple signals that are combined in any suitable manner.

Figure 2:
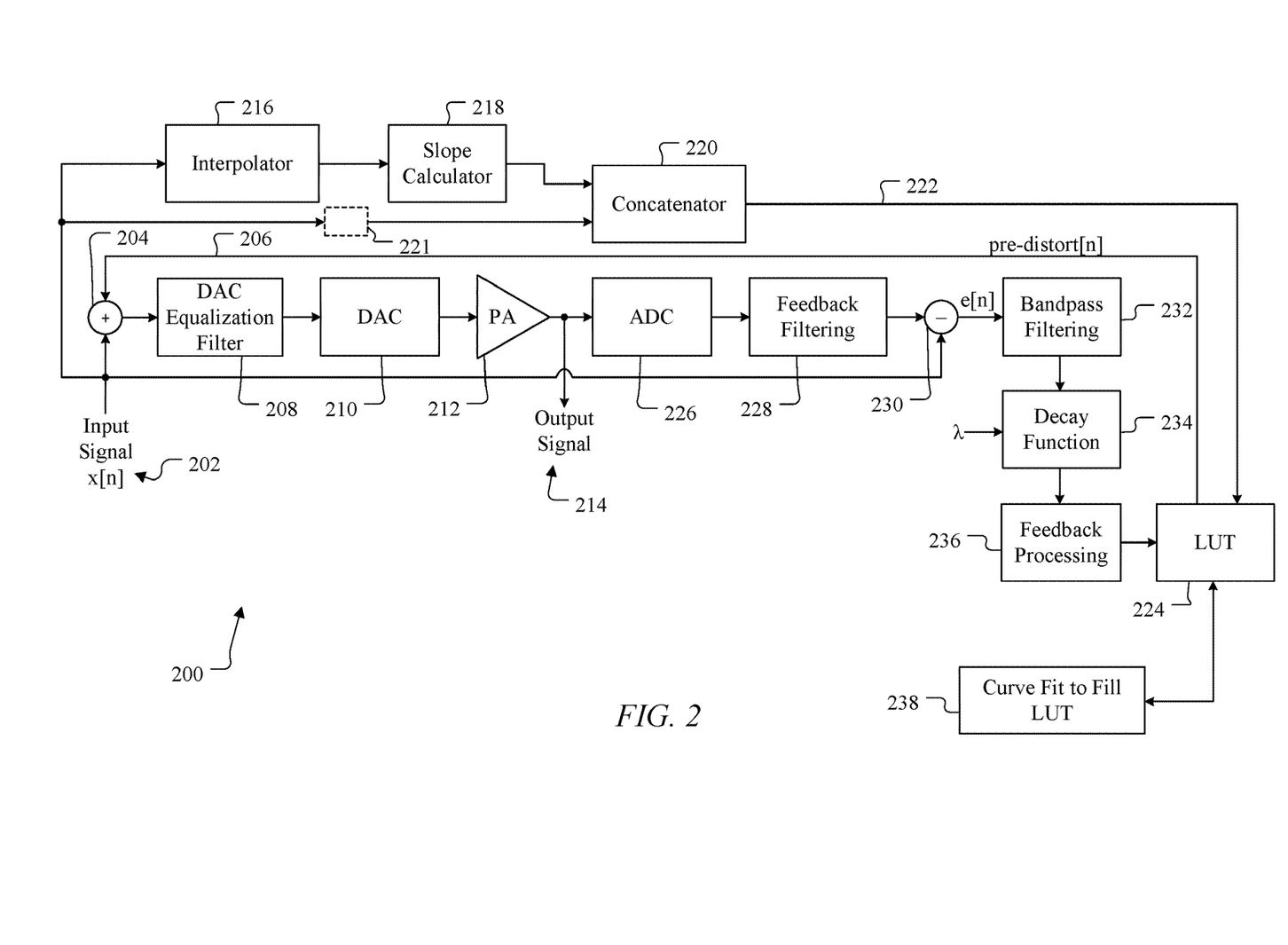
FIG. 2 illustrates a first example implementation of a model-free sample-based approach for power amplifier linearization in real-time in accordance with this disclosure.

FIG. 2 illustrates a first example implementation of a model-free sample-based approach 200 for power amplifier linearization in real-time in accordance with this disclosure. In particular, FIG. 2 illustrates a possible implementation of the DPD function 114 and the TAC function 124 within the processing device 106 of FIG. 1. However, the approach 200 shown in FIG. 2 can be implemented in any other suitable device or system.

As shown in FIG. 2, samples 202 (denoted x[n]) of a signal to be amplified and transmitted are received. These samples 202 can be received from any suitable source. For example, the samples 202 may represent digital values contained in the input signal 113 received by the DPD function 114. As noted above, the input signal 113 may contain digital values generated by an ADC (such as an ADC 104*a*) or digital values output by one of the functions 110, 112.

The samples 202 are provided to an adder 204, which combines the samples 202 with pre-distortion values 206 (denoted pre-distort[n]) provided by other components shown in FIG. 2. The pre-distortion values 206 represent values used to pre-distort the signal 113 to be transmitted prior to power amplification, ideally so that the power amplification appears to be linear with respect to the input signal 113. For each sample 202, the adder 204 adds the sample 202 to its corresponding pre-distortion value 206 to generate a pre-distorted sample value. The pre-distorted sample values generated by the adder 204 are provided to a DAC equalization filter 208, which filters the values to produce equalized values having a flat spectral output. This can be done to help linearize the transmit chain.

The equalized values are provided as inputs to a DAC 210. In some embodiments, the DAC 210 can represent the DAC 118 in FIG. 1. The DAC 210 converts the digital values from the filter 208 into an analog signal, which is provided to at least one power amplifier 212. In some embodiments, the power amplifier 212 can represent the power amplifier 120 in FIG. 1. The power amplifier 212 amplifies the signal provided by the DAC 210 to produce an output signal 214. Ideally, combining the samples 202 of the input signal 113 with the pre-distortion values 206 allows the power amplifier 212 to at least appear to operate more (and possibly substantially) linearly when producing the output signal 214 compared to operation of the power amplifier 212 without the pre-distortion.

The samples 202 include any suitable values representing an input signal, such as twelve-bit or other N-bit samples. The adder 204 includes any suitable structure configured to combine values. The pre-distortion values 206 include any suitable values used to pre-distort samples of an input signal, such as ten-bit or other M-bit values (where M≤A). The equalization filter 208 includes any suitable structure configured to filter values, such as a finite impulse response (FIR) filter. The DAC 210 includes any suitable structure configured to convert digital values into an analog signal. The power amplifier 212 includes any suitable structure configured to amplify an RF signal or other signal. The output signal 214 includes any suitable signal to be transmitted, such as an RF, microwave, or other wireless signal.

In this example, the pre-distortion values 206 are generated by providing the samples 202 of the input signal 113 to an interpolator 216, which uses the samples 202 to interpolate additional values of the input signal 113 between the samples 202. The outputs from the interpolator 216 are provided to a slope calculator 218, which calculates a slope of the input signal 113 at each sample 202. The slope can be used here as representative of the frequency of the input signal 113 at each sample 202. The slope calculator 218 can use any suitable technique to identify the slope of the input signal 113 at each sample 202. For example, the slope calculator 218 may calculate the slope between a first sample 202 and the next sample and calculate the slope between the same first sample 202 and the prior sample using the interpolated values, average the two slopes, and scale the average slope. In some embodiments, the slope calculator 218 can calculate the slope and output one of multiple slope codes representing the calculated slope. In particular embodiments, for instance, the slope calculator 218 may output one of thirty-two slope codes for each sample 202, where the selected slope code for each sample 202 most closely matches the actual slope identified by the slope calculator 218 for that sample 202. Essentially, this quantizes the slope of each sample 202 into one of a plurality of expected values.

The outputs of the slope calculator 218 are provided to a concatenator 220. The concatenator 220 also receives or determines magnitude (amplitude) codes associated with the samples 202. Similar to the slope codes, the magnitude codes can identify the approximate magnitudes of the samples 202, again essentially quantizing the magnitude of each sample 202 into one of a plurality of expected values. In some embodiments, the magnitude codes associated with the samples 202 can be determined using a magnitude calculator 221. The magnitude calculator 221 can use any suitable technique to identify the magnitude of the input signal 113 at each sample 202. For example, the magnitude calculator 221 may extract the $2^{N-1}$ most-significant bits from each N-bit sample 202, or the magnitude calculator 221 may add a value of $(2^{N-1}+1)$ to each N-bit sample 202. Note, however, that the magnitude calculator 221 may be omitted if the concatenator 220 is configured to identify suitable magnitude codes. The concatenator 220 concatenates or otherwise combines the magnitude and slope codes in order to generate index values 222. The index values 222 represent a combination of the magnitude (amplitude) and slope (frequency) of the input signal 113 at each sample 202.

A lookup table (LUT) 224 stores pre-distortion values 206 for different combinations of magnitude and slope codes. The index values 222 here are used to access the lookup table 224 and identify the pre-distortion values 206 to be combined with the samples 202. Thus, as a stream of samples 202 is received, a stream of index values 222 is produced and used to access the lookup table 224, and the pre-distortion values 206 provided to the adder 204 are selected based on the index values 222.

The lookup table 224 contains one-to-one or many-to-one mappings of magnitude and slope codes (or other input signal sample characteristics) to pre-distortion values 206. That is, each input signal sample characteristic can be associated with a pre-distortion value 206. It is possible for multiple input signal sample characteristics to be associated with the same pre-distortion value 206, such as when multiple entries in the lookup table 224 contain the same pre-distortion value 206. Graphically, the contents of the lookup table 224 might be viewed as a three-dimensional surface, where a first dimension represents the magnitude codes, a second dimension represents the slope codes, and a third dimension represents the pre-distortion values. However, in a practical implementation, the lookup table 224 can be arranged in any suitable manner. In some embodiments, for example, the lookup table 224 can be arranged as a one-dimensional array of values (and thus accessible using a concatenation of the magnitude and slope codes). In other embodiments, the lookup table 224 can be arranged as a two-dimensional array of values that are each accessible using a magnitude code-slope code pair, and the concatenator 220 can be omitted.

The interpolator 216 includes any suitable structure configured to interpolate values between samples of an input signal. The slope calculator 218 includes any suitable structure configured to identify slopes or slope codes associated with samples of an input signal. The concatenator 220 includes any suitable structure configured to concatenate or otherwise combine multiple values. The magnitude calculator 221 includes any suitable structure configured to identify magnitudes or magnitude codes associated with samples of an input signal. The index values 222 include any suitable values that can be used to access different pre-distortion values in a lookup table. The lookup table 224 includes any suitable data structure configured to store pre-distortion values. In some embodiments, the lookup table 224 may include $2^{16}$ (65,536) entries, which can be accessed using a five-bit slope code and an eleven-bit magnitude code. Of course, the lookup table 224 can have any other suitable size and arrangement and be accessed in any other suitable manner.

Effectively, the adder 204, DAC equalization filter 208, DAC 210, interpolator 216, slope calculator 218, concatenator 220, magnitude calculator 221, and lookup table 224 operate in a "feedforward" path. That is, these components are used to receive and process incoming samples 202 and generate pre-distortion values 206 that are used to modify those samples 202, which occur prior to power amplification. In some embodiments, the components in the feedforward path can be implemented substantially or entirely within an FPGA or other real-time processing device, allowing the feedforward path to operate extremely quickly when pre-distorting the input signal 113.

In contrast, additional components shown in FIG. 2 are used in a "feedback" path. These components are used to update at least some of the pre-distortion values contained in the lookup table 224, such as to account for changing conditions of the power amplifier 212 or other inaccuracies in the pre-distortion values. Effectively, these components implement the TAC function 124 described above. Of course, the TAC function 124 can be implemented in any other suitable manner. Note that the lookup table 224 here may be updated continuously, periodically, intermittently, or at any other suitable time(s) using the TAC function 124. As a particular example, the digital pre-distortion in the feedforward path may operate at a higher data rate (such as 320 MHz), and the updating in the feedback path may operate at a lower data rate (such as 50 MHz).

As shown in FIG. 2, a small portion of the output signal 214 can be obtained from the power amplifier 212 or other component (such as a splitter or sampler) and provided to an ADC 226, which converts the portion of the output signal 214 into digital values. The digital values are processed using a feedback filtering function 228, which filters the digital values. Various types of filtering can be performed here. For instance, an equalization filter (such as a FIR filter) can be used to produce values having a flat spectral output in order to help linearize the receive chain. Also, a delay filter can be used to produce delayed values to help synchronize operations, such as by applying a frequency-dependent group delay between the DAC 210 and the ADC 226. This can be done, for instance, to provide time and amplitude alignment between the samples 202 and the digital values in later operations.

The filtered outputs are provided to an adder 230, which also receives the samples 202 of the input signal. The adder 230 operates to subtract the samples 202 of the input signal 113 from the filtered outputs in order to identify errors (denoted e[n]) between these values. The error values identify the differences between an expected signal (as defined by the samples 202 of the input signal 113) and the actual output signal 214. As noted above, however, the expected signal can be based on other values, such as digitized values representing the input to the power amplifier 212.

The error values are subjected to a bandpass filtering function 232, which can be used to output values within a desired frequency band. Note that the bandpass filtering function 232 or a separate component can also be used to implement a linear distortion filter, which removes linear components so that only values representing non-linear distortion components of the power amplifier 212 are processed further. This helps to avoid bias in the further processing. The filtered error values are subjected to a decay function 234, which applies a decay factor (denoted A) to the error values by multiplying the error values by the decay factor. The decay factor helps to control changes made to the pre-distortion values in the lookup table 224 based on the error values, such as to account for diminishing memory effects.

A feedback processing function 236 processes the outputs from the decay function 234 in order to make actual updates to one or more pre-distortion values in the lookup table 224. For example, given a specific pre-distortion value LUT [index] in the lookup table 224 (where index represents a specific one of the index values 222), the feedback processing function 236 can update the specific pre-distortion value using a formula of:

$$\text{LUT[index]} = \text{LUT[index]} + \lambda \times e[i] \quad (1)$$

Here, e[i] represents the error for the sample 202 associated with the index value. This indicates that the specific pre-distortion value in the lookup table 224 for a specific pair of magnitude and slope codes is increased or decreased by a scaled version of the error value e[i], where the scaling is controlled by the decay factor λ. If there are multiple error values associated with the same pair of magnitude and slope codes, the feedback processing function 236 can also perform other functions, such as averaging the multiple error values and using the averaged error value as the e[i] value in Equation (1) above.

Note that in some cases, the lookup table 224 may lack entries (or lack reliable entries) at certain times, such as upon startup or during a significant change in the input signal 113. In response to such an event, a curve-fitting function 238 can be used to insert at least some initial pre-distortion values into the lookup table 224 based on the current input signal. In some embodiments, the curve-fitting function 238 may only be needed to initially populate the lookup table 224, and subsequently the TAC function 124 can update the pre-distortion values in the lookup table 224.

The ADC 226 includes any suitable structure configured to convert digital values into an analog signal. The feedback filtering function 228 includes any suitable structure configured to filter values, such as a FIR filter. The adder 230 includes any suitable structure configured to combine values. The bandpass filtering function 232 includes any suitable structure configured to pass values within a specified frequency range and reject other values. The decay function 234 includes any suitable structure configured to apply a decay factor to values, such as a multiplier. The feedback processing function 236 includes any suitable structure configured to process values and identify updated pre-distortion values for a lookup table. The curve-fitting function 238 includes any suitable structure configured to fit pre-distortion values in a lookup table to a curve. Note, however, that the use of the curve-fitting function 238 is optional and that other approaches can be used to initially populate the lookup table 224. For example, other techniques can include using default values in the lookup table 224.

In some embodiments, all of the various components shown in FIG. 2 (except the power amplifier 212 and possibly the DAC 210 and ADC 226) may be implemented using a single FPGA. The use of an FPGA allows extremely fast operation, both in terms of pre-distorting the samples 202 of the input signal 113 using the feedforward path components and updating the pre-distortion values in the lookup table 224 using the feedback path components.

Figure 3:
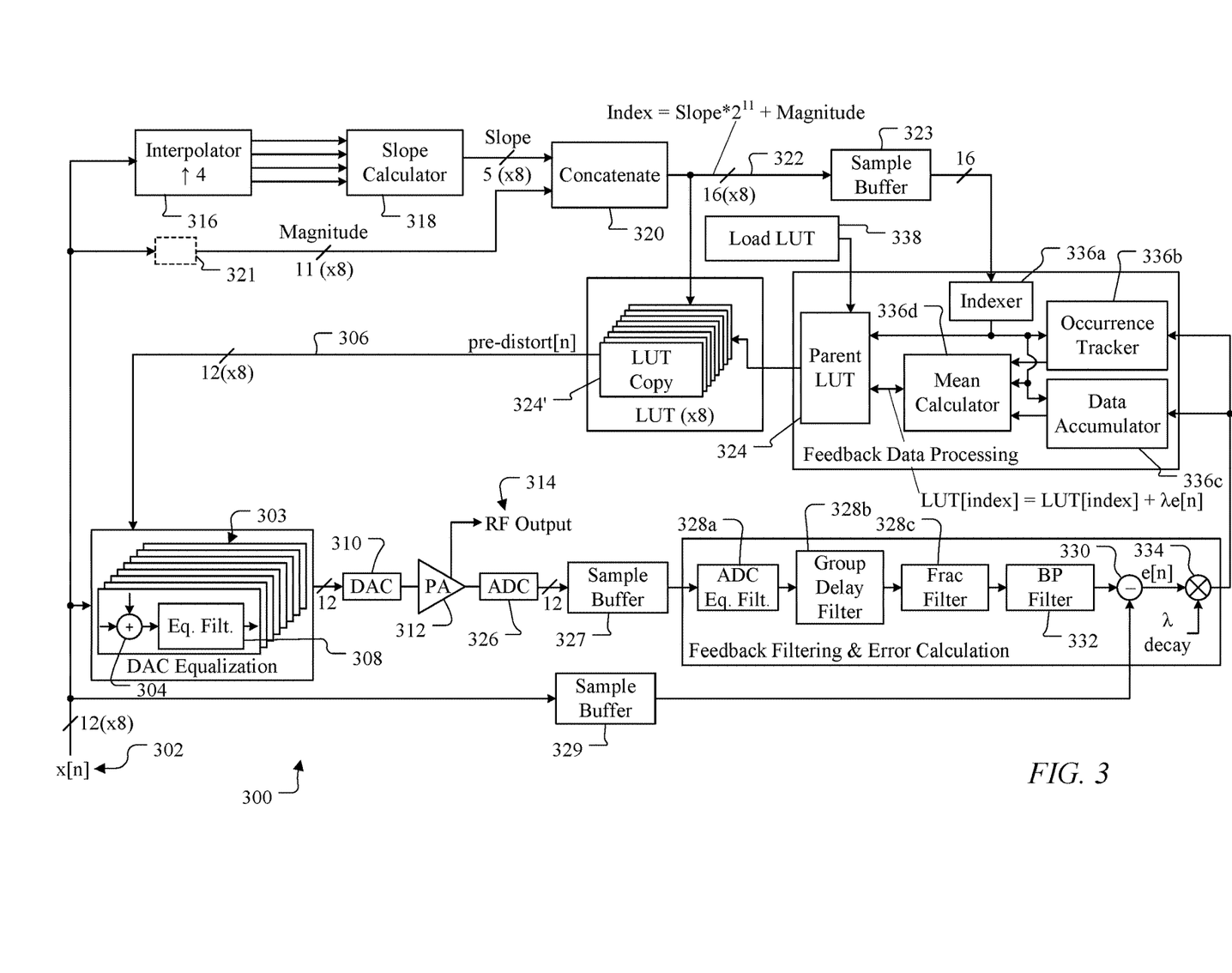
FIG. 3 illustrates a second example implementation of a model-free sample-based approach for power amplifier linearization in real-time in accordance with this disclosure.

FIG. 3 illustrates a second example implementation of a model-free sample-based approach 300 for power amplifier linearization in real-time in accordance with this disclosure. In particular, FIG. 3 illustrates another possible implementation of the DPD function 114 and the TAC function 124 within the processing device 106 of FIG. 1. However, the approach 300 shown in FIG. 3 can be implemented in any other suitable device or system. The approach 300 shown in FIG. 3 is a more detailed and specific version of the implementation of the approach 200 shown in FIG. 2. The approach 300 shown in FIG. 3 also supports the use of parallel processing for samples of an input signal 113.

As shown in FIG. 3, samples 302 are received in parallel streams and processed. This may allow, for example, the digital clock rate used in FIG. 3 to be substantially lower than the analog clock rate. In some embodiments, the samples 302 represent twelve-bit values (meaning N equals twelve), and eight samples 302 are received in parallel at a rate of 320 MHz per stream. The samples 302 are provided to multiple sets 303 of components (one per stream), and each set 303 includes an adder 304 and an equalization filter 308. Each adder 304 combines the samples 302 in one of the streams with associated pre-distortion values 306, and each equalization filter 308 filters the combined values to produce values having a flat spectral output and help linearize the transmit chain. The equalization filters 308 can also decimate values in order to reduce the number of bits in the outputs of the equalization filters 308. In some embodiments, the equalization filters 308 represent FIR filters each having 24 taps and providing 8:1 decimation at a rate of 320 MHz per stream. The outputs of the equalization filters 308 are provided to a DAC 310, which converts the digital values into an analog signal. The analog signal is provided to at least one power amplifier 312, which amplifies the analog signal and generates an output signal 314. In some embodiments, the DAC 310 can have a sampling rate of 2.56 to 6.4 giga-samples per second (GSPS). The DAC 310 may represent the DAC 118 in FIG. 1, and the power amplifier 312 may represent the power amplifier 120 in FIG. 1.

The samples 302 are also provided to an interpolator 316, which interpolates additional values between the samples 302 for each stream. In some embodiments, the interpolator 316 represents an interpolator that quadruples the number of sample values and has 128 taps. The outputs from the interpolator 316 are provided to a slope calculator 318, which generates slope codes for the samples 302 in each stream. In this example, the slope codes are five-bit slope codes, although other numbers of bits can be used here. A concatenator 320 concatenates or otherwise combines the slope codes with magnitude (amplitude) codes associated with the samples 302 for each stream. The concatenator 320 may generate the magnitude codes or receive the magnitude codes from another component (such as a magnitude calculator 321). In this example, the magnitude codes are eleven-bit magnitude codes, although other numbers of bits can be used here. The outputs from the concatenator 320 represent index values 322 for the samples 302 in each stream. In some embodiments, the interpolator 316, slope calculator 318, and concatenator 320 operate at a rate of 320 MHz per stream.

In this example, rather than use a single lookup table, a parent lookup table 324 and multiple lookup table copies 324' are used. Any suitable number of copies 324' can be used here, such as one copy per parallel stream of samples 302. Again, the parent lookup table 324 and lookup table copies 324' contain one-to-one or many-to-one mappings of magnitude and slope codes (or other input signal sample characteristics) to pre-distortion values 306. Here, the index values 322 for each stream can be used to access a separate lookup table copy 324' in order to obtain the pre-distortion values 306 associated with that stream. In some embodiments, the pre-distortion values 306 are provided to the adders 304 at a rate of 320 MHz per stream. The index values 322 are also stored temporarily in a buffer 323, which represents any suitable memory configured to store multiple values. Any suitable number of index values 322 can be stored in the buffer 323.

A small portion of the output signal 314 from the power amplifier 312 or other component (such as a splitter or sampler) is provided to an ADC 326, which converts the analog signal into digital values. In some embodiments, the ADC 326 can have a sampling rate of 2.56 to 4.0 GSPS. Digital values from the ADC 326 are stored in a buffer 327, and the samples 302 are stored in a buffer 329. Each buffer 327 and 329 represents any suitable memory configured to store multiple values, and any suitable number of values can be stored in each buffer 327 and 329. In some embodiments, values are stored in the buffers 327 and 329 at a rate of 320 MHz per stream.

Feedback filtering and error calculation operations occur using the values stored in the buffers 327 and 329. For example, an ADC equalization filter 328a filters the digital values in the buffer 327 to produce values having a flat spectral output and helps linearize the receive chain. In some embodiments, the equalization filter 328a represents a FIR filter having 64 taps and operates at a rate of 50 MHz. The outputs of the equalization filter 328a are provided to a group delay filter 328b, which can be used to produce delayed values to help synchronize operations in the system, such as a frequency-dependent group delay between the DAC 310 and the ADC 326. In some embodiments, the group delay filter 328b represents a FIR filter having 64 taps and operates at a rate of 50 MHz. The outputs of the group delay filter 328b are provided to a fractional-delay filter 328c, which can be used to delay some of the feedback values relative to others of the feedback values. In some embodiments, the fractional-delay filter 328c represents a FIR filter having 64 taps and operates at a rate of 50 MHz. A bandpass filter 332 filters the outputs of the fractional-delay filter 328c. In some embodiments, the bandpass filter 332 represents a FIR filter having 128 taps and operates at a rate of 50 MHz. The bandpass filter 332 can also be used to implement a linear distortion filter to remove linear components so that only values representing non-linear distortion components of the power amplifier 312 are processed further. An adder 330 subtracts the original values of the samples 302 (as provided by the buffer 329) from the filtered values to generate error values e[n]. Once again, note that while the samples 302 are used here to represent an expected signal, other values can be used. A decay function 334 applies a decay factor λ to the error values e[n] by multiplying the error values by the decay factor. In some embodiments, the adder 330 and the decay function 334 operate at a rate of 50 MHz.

Feedback processing here involves the use of various components 336a-336d. An indexer 336a receives the index values 322 that are currently stored in the buffer 323, such as at a rate of 50 MHz. The indexer 336a provides the index values to an occurrence tracker 336b, a data accumulator 336c, a mean calculator 336d, and the parent lookup table 324. The occurrence tracker 336b tracks the number of times that the decay function 334 outputs a value for each index value 322 that appears in the current buffer 323. The data accumulator 336c also receives the outputs of the decay function 334 and sums those outputs on a per index basis. This means that the data accumulator 336c sums all outputs of the decay function 334 associated with the same index value 322 (if there are multiple values). The mean calculator 336d averages the values output by the data accumulator 336c on a per index basis. Effectively, the components 336b-336d here are averaging the outputs of the decay function 334 for each index value 322. If multiple samples 302 are received having the same magnitude and slope codes within the same buffer period, the update to the parent lookup table 324 for that magnitude code-slope code combination is based on the average of the errors for those samples 302. In some embodiments, the components 336a-336d operate at a rate of 50 MHz.

The parent lookup table 324 here is updated based on the values produced by the mean calculator 336d, where the updated values are inserted into the parent lookup table 324 based on the index values from the indexer 336a. At least the entries in the parent lookup table 324 that are updated are replicated to the lookup table copies 324' for use in pre-distorting subsequent samples 302 of the input signal 113. In some embodiments, the lookup table copies 324' are updated at a rate of 50 MHz. If needed, a lookup table load function 338 (such as a curve-fitting function) can be used to insert at least some initial pre-distortion values into the parent lookup table 324, such as based on the initial samples 302 of the input signal. However, other techniques for initializing the parent lookup table 324 can also be used.

The following represent example features and benefits of these approaches 200 and 300, at least in certain embodiments. These techniques are able to implement real-time linearization of a power amplifier using an FPGA or other real-time processor implementation. This enables continuous streaming of data for real-time processing, which allows for real-time linearization of the power amplifier. Also, these techniques are able to handle many different types of waveforms and bandwidths. Moreover, in some embodiments, one or more techniques can be used to reduce the size of the lookup table(s) 224, 324, 324' in order to provide more compact implementations and faster operations. For instance, non-uniform distributions of magnitude and slope codes can be used to reduce the table size, such as by having larger "bins" for certain magnitude and slope codes (like codes that are used less often). Further, various filters can have reduced dimensions, either through data-based reductions in filter dimensions or through the use of a fast FIR architecture. Beyond that, updates to the lookup table(s) 224, 324, 324' can be performed more efficiently through selective updates of a subset of the pre-distortion values in the lookup table(s) 224, 324, 324', namely by updating only those entries in the lookup table(s) 224, 324, 324' that are actually used to provide pre-distortion values 206 and 306 for pre-distortion of an input signal. As an example, inputs to the DAC 210 or 310 have a finite precision (such as twelve bits) and thus can only generate a limited number of unique sample values (such as $2^{12}$ or 4,096 values). Thus, there may be only a need to update 4,096 entries in the lookup table(s) 224, 324, 324' and not all 65,536 entries. In addition, the use of the linear distortion filter (to remove linear components so that only values representing non-linear distortion components of a power amplifier are processed) helps to eliminate residual distortion error signal bias and improve performance. In some instances, this can provide a 2 to 5 dB or more improvement in spurious-free dynamic range (SFDR) performance.

Note that in these examples, the magnitude and slope of an input signal (as defined by the samples 202, 302) are used as indices to access the lookup table 224, 324, 324'. However, other or additional characteristics of the input signal can also be used to generate indices for accessing a lookup table. For example, a curvature of the input signal can be determined using the second derivative of adjacent input samples 202, 302 and used as part of the index into the lookup table 224, 324, 324'. As another example, a historical trend of the input signal can be determined using current and previous magnitudes/slopes of multiple input samples 202, 302 and used as part of the index into the lookup table 224, 324, 324'. In general, any suitable characteristic(s) of a signal to be amplified can be used to generate indices into a lookup table.

Although FIGS. 2 and 3 illustrate examples of implementations of model-free sample-based approaches for power amplifier linearization in real-time, various changes may be made to FIGS. 2 and 3. For example, specific values are provided above for characteristics such as bit widths, numbers of streams, and data rates. However, these values are for illustration and explanation only, and other suitable values can be used for these characteristics.

Figure 4:
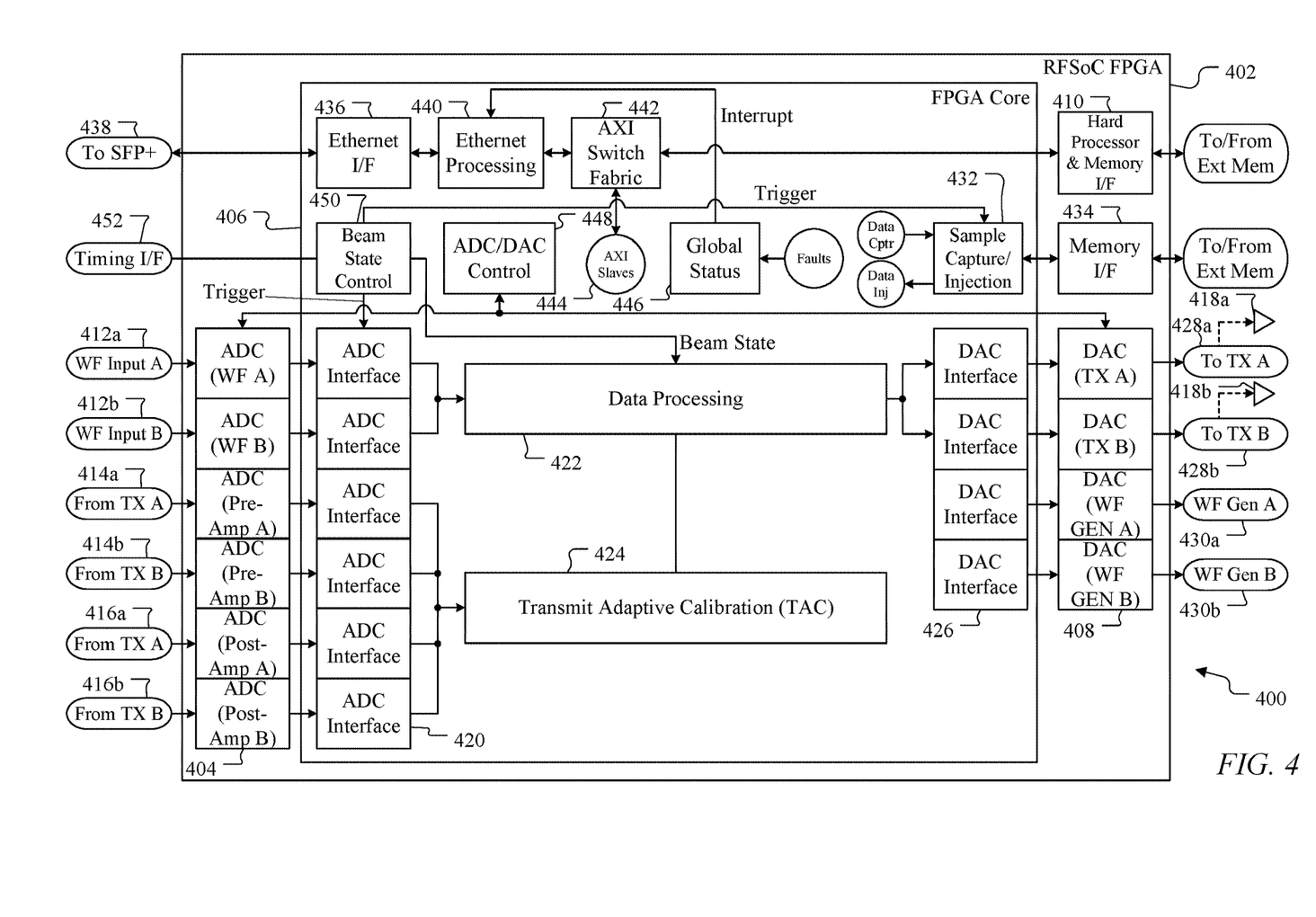
FIG. 4 illustrates another example system supporting a model-free sample-based approach for power amplifier linearization in real-time in accordance with this disclosure.

FIG. 4 illustrates another example system 400 supporting a model-free sample-based approach for power amplifier linearization in real-time in accordance with this disclosure. In particular, the system 400 shown in FIG. 4 applies the same general techniques described above. However, the system 400 shown in FIG. 4 has been extended to support multi-channel transmitter/amplifier linearization.

As shown in FIG. 4, the system 400 can be implemented using a radio frequency system-on-a-chip (RFSoC) device 402. The device 402 includes integrated ADCs 404, an FPGA core 406, integrated DACs 408, and at least one integrated processor core 410 (such as ARM CORTEX-A53 and ARM CORTEX-R5 processors). One specific example of such a device 402 is a ZYNQ ULTRASCALE+ device from XILINX, INC. This type of device 402 can be leveraged to implement model-free sample-based power amplifier linearization, where the feedforward real-time correction occurs in the FPGA core 406 and the adaptive feedback processing occurs in the processor core 410. This type of design allows for the pre-distortion of multiple input signals simultaneously, such as up to four input signals per device 402 (although only two input signals are shown here in FIG. 4). Additional application-defined algorithms can also be supported, such as beamforming, waveform generation, waveform synchronization, and waveform capture.

As shown in FIG. 4, the system 400 receives two different input signals 412a-412b from one or more waveform (WF) generators. The one or more waveform generators represent one or more sources of the input signals 412a-412b. The input signals 412a-412b can be obtained from a single waveform source or from multiple (possibly independent) waveform sources. The system 400 also receives two "pre-amplifier" feedback signals 414a-414b and two "post-amplifier" feedback signals 416a-416b. The two pre-amplifier feedback signals 414a-414b represent portions of two signals input to two different power amplifiers 418a-418b. The two post-amplifier feedback signals 416a-416b represent portions of two outputs generated by the two power amplifiers 418a-418b. The ADCs 404 convert all of these analog inputs into digital values and provide the digital values to the FPGA core 406.

The FPGA core 406 includes various ADC interfaces 420, which facilitate the receipt of various digital values from the ADCs 404. The digital values corresponding to the input signals 412a-412b are provided via the appropriate ADC interfaces 420 to a data processing function 422, and the digital values corresponding to the feedback signals 414a-414b, 416a-416b are provided via the appropriate ADC interfaces 420 to a TAC function 424. The data processing function 422 implements the feedforward functionality of the DPD function 114 and pre-distorts both of the input signals 412a-412b in the same or similar manner described above. The TAC function 424 cooperates with the at least one processor core 410 to modify the pre-distortion values in one or more lookup tables used by the data processing function 422 based on the feedback signals 414a-414b, 416a-416b. For instance, the TAC function 424 may store sample values associated with the feedback signals 414a-414b, 416a-416b in one or more buffers, and the processor core 410 may retrieve and process the buffered values to identify updated pre-distortion values for the lookup table(s) used by the data processing function 422.

Sample values representing the input signals 412a-412b (after pre-distortion by the data processing function 422) are output via two DAC interfaces 426 to two of the DACs 408. These DACs 408 convert the pre-distorted digital values into analog output signals 428a-428b. The output signals 428a-428b can be provided directly to the power amplifiers 418a-418b, or the output signals 428a-428b can be further processed prior to amplification by the power amplifiers 418a-418b.

Two additional DAC interfaces 426 and DACs 408 can be used to produce waveform generation signals 430a-430b, which may be fed back as the input signals 412a-412b for testing or other purposes. A sample capture/injection function 432 can be used to capture data samples passing through the FPGA core 406 and to inject data samples into the FPGA core 406 or other components of the system 400. For instance, data samples representing specific types of waveforms can be provided to the bottom two DAC interfaces 426 or DACs 408 in order to generate desired waveform generation signals 430a-430b. Captured data can be provided to and injected data can be received from an external memory via at least one memory interface 434. Note, however, that these functions are not necessarily required, so these components may be omitted or not used.

Additional components in the RFSoC device 402 can be used to support additional functionality. For example, an Ethernet interface 436 can be used to transmit or receive data over a small form-factor pluggable plus (SFP+) interface 438 or other interface(s). An Ethernet processing function 440 can be used to process incoming or outgoing Ethernet-formatted data. An advanced extensible interface (AXI) switch fabric 442 or other switch fabric can be used to route data between various components, including the Ethernet processing function 440, the at least one processor core 410, and AXI slaves 444 or other suitable devices. One possible function of the Ethernet processing function 440 is to report the contents of one or more global status registers 446 to identify a status (and possibly any faults) of the RFSoC device 402 and to provide this information via the interface 438. This may allow, for instance, an external component to monitor the status of the RFSoC device 402 and identify any problems with the RFSoC device 402. An ADC/DAC control unit 448 controls the operation of the ADCs 404 and the DACs 408, such as by controlling the sampling rates and sampling times of the ADCs 404 and the DACs 408. A beam state control unit 450 can receive a timing input through a timing interface 452 and control the ADC interfaces 420 and the data processing function 422 based on whether valid input signals are actually being received and to indicate the start of a new waveform. Of course, various ones of these additional components may be omitted or not used as needed or desired.

The approach shown in FIG. 4 can achieve many or all of the benefits discussed above, such as providing real-time amplifier linearization with arbitrary and changing waveforms and wide bandwidths. Moreover, the approach shown in FIG. 4 can achieve these benefits simultaneously for multiple input signals to be transmitted, rather than for a single input signal. As a result, the system 400 can be used in various applications involving the use of multiple input signals, such as those that require multiple phase- and gain-balanced channels.

Although FIG. 4 illustrates another example of a system 400 supporting a model-free sample-based approach for power amplifier linearization in real-time, various changes may be made to FIG. 4. For example, the same approach shown in FIG. 4 can be implemented using other devices that may not integrate one or more ADCs, one or more DACs, and one or more processor cores with an FPGA core.

Note that the techniques for pre-distortion shown in FIGS. 1 through 4 above are generally amplifier-agnostic, meaning the same techniques can be used for different types of power amplifiers. Example types of power amplifiers that can be used include commercial LNAs, MMIC amplifiers, and TIMMs containing multiple MMIC amplifiers. Also, the techniques for pre-distortion shown in FIGS. 1 through 4 can be used to obtain intermodulation product and harmonic suppression, spectral regrowth, and notch depth improvements (possibly as high as 10 to 15 dB SFDR or more).

Figure 5A:
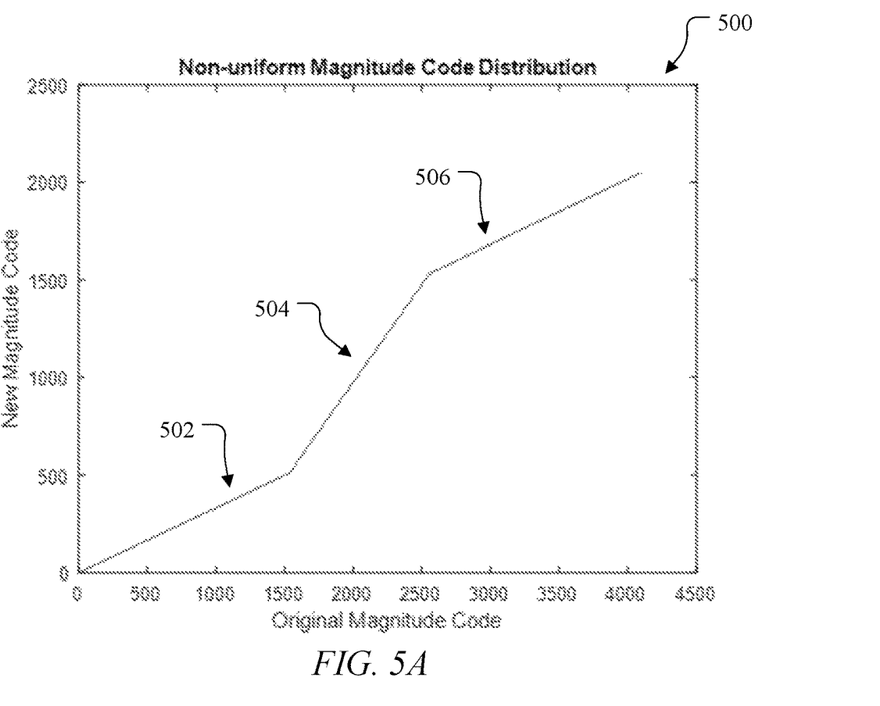
FIGS. 5A and 5B illustrate example non-uniform magnitude and slope codes that may be used in a model-free sample-based approach for power amplifier linearization in real-time in accordance with this disclosure.
Figure 5B:
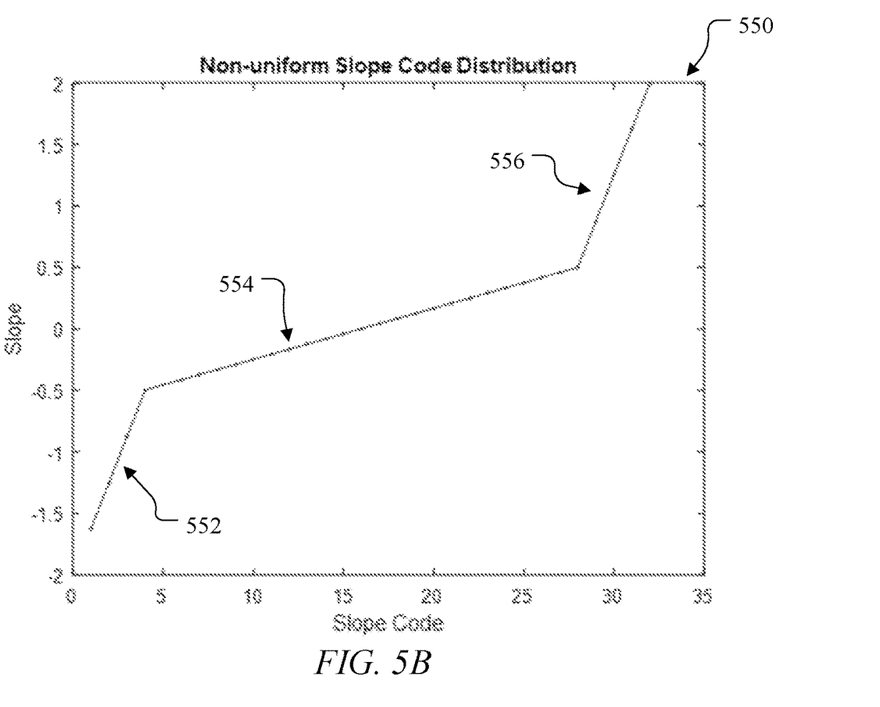

FIGS. 5A and 5B illustrate example non-uniform magnitude and slope codes that may be used in a model-free sample-based approach for power amplifier linearization in real-time in accordance with this disclosure. As noted above, in some embodiments, magnitude and slope codes used to access a lookup table 224, 324, 324' can be non-uniformly distributed. FIGS. 5A and 5B illustrate examples of how the magnitude and slope codes can be non-uniformly distributed. However, uniform distributions and other non-uniform distributions can be used with the magnitude and slope codes.

As shown in FIG. 5A, a graph 500 plots how original magnitude codes (plotted along the horizontal axis) can be converted into new magnitude codes (plotted along the vertical axis) in a non-uniform manner. In some embodiments, the original magnitude codes may represent the $2^{N-1}$ most-significant bits from each N-bit sample 202, 302 or the sums of each of the N-bit samples 202, 302 and a value of $(2^{N-1}+1)$.

In this particular example, it is assumed that there are 4,096 original magnitude codes (assuming twelve-bit sample values), and the graph 500 non-uniformly reduces the number of magnitude codes to 2,048. In a first region 502 of the graph 500, the original magnitude codes are translated into new magnitude codes each spanning a wider range, creating larger bins. For instance, 1,536 original magnitude codes might be mapped to 512 new magnitude codes. In a second region 504 of the graph 500, the original magnitude codes are mapped into new magnitude codes each spanning a smaller range, creating smaller bins. For example, 1,024 original magnitude codes might be mapped to 1,024 new magnitude codes. In a third region 506 of the graph 500, the original magnitude codes are again translated into new magnitude codes each spanning a wider range, creating larger bins. For instance, 1,536 original magnitude codes might again be mapped to 512 new magnitude codes.

The ability to use non-uniform magnitude codes allows at least one smaller lookup table 224, 324, 324' to be used. This can be particularly beneficial in embodiments that use multiple copies of a parent lookup table, such as in the approach shown in FIG. 3. This also allows the digitization of the magnitude codes to be tailored in order to maintain the resolution of the lookup table(s) in the non-linear region of a power amplifier while reducing the size of the lookup table(s).

As shown in FIG. 5B, a graph 550 similarly plots how slope codes (plotted along the horizontal axis) can be mapped to slope values (plotted along the vertical axis) in a non-uniform manner. In this particular example, it is assumed that there are 32 potential slope codes that can be mapped to various values between ±2, and the graph 550 represents this mapping non-uniformly. In a first region 552 of the graph 550, each of the slope codes represents a wider range of slope values, creating larger bins. For instance, four slope codes might be mapped to different slope values between −2 and −0.5. In a second region 554 of the graph 550, each of the slope codes represents a smaller range of slope values, creating smaller bins. For example, 28 slope codes might be mapped to different slope values between −0.5 and +0.5. In a third region 556 of the graph 550, each of the slope codes again represents a wider range of slope values, creating larger bins. For instance, four slope codes might be mapped to different slope values between +0.5 and +2. The ability to use non-uniform slope codes again allows the digitization of the slope codes to be tailored in order to maintain the resolution of the lookup table in the non-linear region of a power amplifier.

Although FIGS. 5A and 5B illustrate examples of non-uniform magnitude and slope codes that may be used in a model-free sample-based approach for power amplifier linearization in real-time, various changes may be made to FIGS. 5A and 5B. For example, the non-uniform mappings shown here are examples only. Any other suitable linear or non-uniform magnitude and slope codes may be used.

Figure 6:
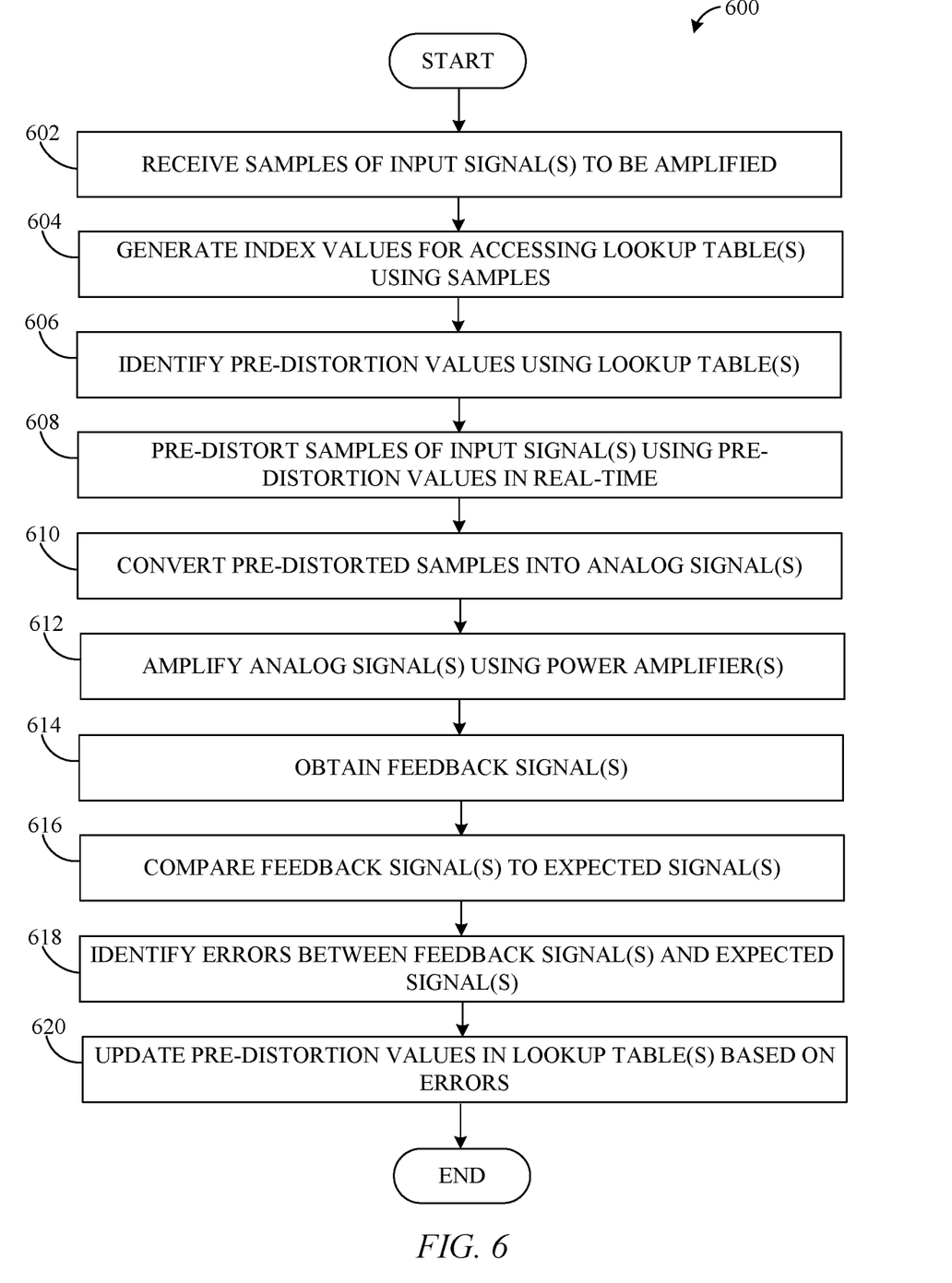
FIG. 6 illustrates an example method for model-free sample-based power amplifier linearization in real-time in accordance with this disclosure.

FIG. 6 illustrates an example method 600 for model-free sample-based power amplifier linearization in real-time in accordance with this disclosure. For ease of explanation, the method 600 is described as involving the use of the system 100 or 400 shown in FIG. 1 or 4, which may support the approach 200 or 300 shown in FIG. 2 or 3. However, the method 600 may be used in any other suitable system.

As shown in FIG. 6, samples of at least one input signal are received at step 602. This can include, for example, the DPD function 114 receiving samples 202 or 302 of at least one input signal 113, 412a-412b. Index values for accessing at least one lookup table are generated using the sample values at step 604. This can include, for example, the DPD function 114 generating magnitude and slope codes associated with the samples and concatenating or otherwise combining the magnitude and slope codes to produce index values 222, 322. As noted above, in some embodiments, the magnitude and slope codes can be non-uniformly distributed across the range of possible magnitude and slope values, although this need not be the case.

Pre-distortion values are identified using the lookup table(s) at step 606. This can include, for example, the DPD function 114 accessing the lookup table(s) 224, 324' using the identified index values 222, 322 to retrieve pre-distortion values 206, 306 at those locations. The samples of the input signal(s) are pre-distorted using the pre-distortion values in real-time at step 608. This can include, for example, the DPD function 114 combining the samples 202, 302 with the pre-distortion values 206, 306. The pre-distorted samples are converted into at least one analog signal at step 610, and the at least one analog signal is amplified using at least one power amplifier at step 612. This can include, for example, one or more DACs 118, 210, 310, 408 converting the digital values into one or more analog signals. This can also include at least one power amplifier 120, 212, 312, 418a-418b amplifying the analog signal(s).

One or more feedback signals are obtained at step 614. This can include, for example, one or more ADCs 104c, 226, 326, 404 obtaining and converting a portion of one or more amplified analog signals into digital values. This may also include one or more ADCs 104d, 404 obtaining and converting a portion of one or more analog signals prior to amplification. The one or more feedback signals are compared to one or more expected signals at step 616, and errors between the feedback and expected signals are identified at step 618. This can include, for example, the TAC function 124 comparing the digital values representing a feedback signal with the original samples 202, 302 or comparing the digital values representing a post-amplifier signal with digital values representing a pre-amplifier signal. If multiple errors are determined for a common magnitude code-slope code pair, this can also include the TAC function 124 averaging the errors. Various pre-distortion values in the lookup table(s) can be updated based on the errors at step 620. This can include, for example, the TAC function 124 applying a decay function to the error values and increasing or decreasing associated entries in the lookup table(s) 224, 324, 324' based on the decayed errors.

Although FIG. 6 illustrates one example of a method 600 for model-free sample-based power amplifier linearization in real-time, various changes may be made to FIG. 6. For example, while shown as a series of steps, various steps in FIG. 6 may overlap, occur in parallel, occur in a different order, or occur any number of times. As a particular example, the feedforward operations performed to pre-distort samples and generate at least one amplified signal (steps 604-612) may occur much faster than the feedback operations performed to update the lookup table(s) (steps 614-620).

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   obtaining samples of an input signal to be amplified;
   determining magnitude codes and slope codes for the samples, wherein at least one of:
   the magnitude codes are non-uniformly distributed across a range of possible magnitude values for the samples such that some of the magnitude codes represent larger bins of possible magnitude values and some of the magnitude codes represent smaller bins of possible magnitude values; and
   the slope codes are non-uniformly distributed across a range of possible slope values for the samples such that some of the slope codes represent larger bins of possible slope values and some of the slope codes represent smaller bins of possible slope values;
   in real-time, pre-distorting at least some of the samples using pre-distortion values from at least one lookup table, the pre-distorted samples to be converted into an analog signal that is amplified by at least one power amplifier, wherein the pre-distortion values at least partially compensate for a non-linear operation of the at least one power amplifier, the magnitude codes and the slope codes used to access the at least one lookup table;
   comparing an output signal generated by the at least one power amplifier to an expected signal to identify errors between the output and expected signals; and updating one or more pre-distortion values in the at least one lookup table based on the identified errors.

2. The method of claim 1, wherein pre-distorting at least some of the samples using the pre-distortion values comprises using a field programmable gate array.

3. The method of claim 1, further comprising:
obtaining samples of multiple input signals to be amplified over time, wherein the multiple input signals have different waveforms and different bandwidths.

4. The method of claim 1, wherein:
the at least one lookup table comprises a parent lookup table and multiple lookup table copies;
obtaining the samples of the input signal comprises obtaining multiple streams of samples;
pre-distorting at least some of the samples comprises pre-distorting at least some of the samples in the multiple streams using pre-distortion values from the lookup table copies; and
updating the one or more pre-distortion values in the at least one lookup table comprises (i) updating one or more pre-distortion values in the parent lookup table and (ii) replicating at least the one or more updated pre-distortion values from the parent lookup table to the lookup table copies.

5. The method of claim 1, wherein updating the one or more pre-distortion values in the at least one lookup table comprises updating a subset of the pre-distortion values in the at least one lookup table, the subset representing the pre-distortion values used to pre-distort the samples.

6. The method of claim 1, further comprising:
applying a linear distortion filter to digital values that are based on the output signal generated by the at least one power amplifier;
wherein the linear distortion filter removes linear components and outputs values representing non-linear distortion components of the at least one power amplifier.

7. The method of claim 1, wherein:
obtaining the samples of the input signal comprises simultaneously obtaining multiple samples of multiple input signals to be amplified; and
pre-distorting at least some of the samples comprises simultaneously pre-distorting at least some of the samples for each of the input signals.

8. An apparatus comprising:
at least one processing device configured to:
obtain samples of an input signal to be amplified;
determine magnitude codes and slope codes for the samples, wherein at least one of:
the magnitude codes are non-uniformly distributed across a range of possible magnitude values for the samples such that some of the magnitude codes represent larger bins of possible magnitude values and some of the magnitude codes represent smaller bins of possible magnitude values; and
the slope codes are non-uniformly distributed across a range of possible slope values for the samples such that some of the slope codes represent larger bins of possible slope values and some of the slope codes represent smaller bins of possible slope values;
in real-time, pre-distort at least some of the samples using pre-distortion values from at least one lookup table, the pre-distorted samples to be converted into an analog signal that is amplified by at least one power amplifier, wherein the pre-distortion values at least partially compensate for a non-linear operation of the at least one power amplifier, the magnitude codes and the slope codes used to access the at least one lookup table;
compare an output signal generated by the at least one power amplifier to an expected signal to identify errors between the output and expected signals; and
update one or more pre-distortion values in the at least one lookup table based on the identified errors.

9. The apparatus of claim 8, wherein the at least one processing device comprises a field programmable gate array.

10. The apparatus of claim 8, wherein the at least one processing device is further configured to obtain samples of multiple input signals to be amplified over time, wherein the multiple input signals have different waveforms and different bandwidths.

11. The apparatus of claim 8, wherein;
the at least one lookup table comprises a parent lookup table and multiple lookup table copies;
to obtain the samples of the input signal, the at least one processing device is configured to obtain multiple streams of samples;
to pre-distort at least some of the samples, the at least one processing device is configured to pre-distort at least some of the samples in the multiple streams using pre-distortion values from the lookup table copies; and
to update the one or more pre-distortion values in the at least one lookup table, the at least one processing device is configured to (i) update one or more pre-distortion values in the parent lookup table and (ii) replicate at least the one or more updated pre-distortion values from the parent lookup table to the lookup table copies.

12. The apparatus of claim 8, wherein:
to update the one or more pre-distortion values in the at least one lookup table, the at least one processing device is configured to update a subset of the pre-distortion values in the at least one lookup table; and
the subset represents the pre-distortion values used to pre-distort the samples.

13. The apparatus of claim 8, wherein:
the at least one processing device is further configured to apply a linear distortion filter to digital values that are based on the output signal generated by the at least one power amplifier; and
the linear distortion filter is configured to remove linear components and output values representing non-linear distortion components of the at least one power amplifier.

14. The apparatus of claim 8, wherein the at least one processing device is configured to:
simultaneously obtain multiple samples of multiple input signals to be amplified; and
simultaneously pre-distort at least some of the samples for each of the input signals.

15. A system comprising:
a field programmable gate array configured to:
obtain samples of an input signal to be amplified;
determine magnitude codes and slope codes for the samples, wherein at least one of:
the magnitude codes are non-uniformly distributed across a range of possible magnitude values for the samples such that some of the magnitude codes represent larger bins of possible magnitude values and some of the magnitude codes represent smaller bins of possible magnitude values; and the slope codes are non-uniformly distributed across a range of possible slope values for the samples such that some of the slope codes represent larger bins of possible slope values and some of the slope codes represent smaller bins of possible slope values; and in real-time, pre-distort at least some of the samples using pre-distortion values from at least one lookup table, the magnitude codes and the slope codes used to access the at least one lookup table;

a digital-to-analog converter configured to convert the pre-distorted samples into an analog signal; and at least one power amplifier configured to amplify the analog signal, wherein the pre-distortion values at least partially compensate for a non-linear operation of the at least one power amplifier;

wherein the field programmable gate array or a processing device is configured to:

compare an output signal generated by the at least one power amplifier to an expected signal to identify errors between the output and expected signals; and update one or more pre-distortion values in the at least one lookup table based on the identified errors.

16. The system of claim 15, wherein the field programmable gate array is further configured to obtain samples of multiple input signals to be amplified over time, wherein the multiple input signals have different waveforms and different bandwidths.

17. The system of claim 15, wherein:

the at least one lookup table comprises a parent lookup table and multiple lookup table copies;

to obtain the samples of the input signal, the field programmable gate array is configured to obtain multiple streams of samples;

to pre-distort at least some of the samples, the field programmable gate array is configured to pre-distort at least some of the samples in the multiple streams using pre-distortion values from the lookup table copies; and to update the one or more pre-distortion values in the at least one lookup table, the field programmable gate array or the processing device is configured to (i) update one or more pre-distortion values in the parent lookup table and (ii) replicate at least the one or more updated pre-distortion values from the parent lookup table to the lookup table copies.

18. The system of claim 15, wherein:

to update the one or more pre-distortion values in the at least one lookup table, the field programmable gate array or the processing device is configured to update a subset of the pre-distortion values in the at least one lookup table; and the subset represents the pre-distortion values used to pre-distort the samples.

19. The system of claim 15, wherein:

the field programmable gate array is further configured to apply a linear distortion filter to digital values that are based on the output signal generated by the at least one power amplifier; and the linear distortion filter is configured to remove linear components and output values representing non-linear distortion components of the at least one power amplifier.

20. The system of claim 15, wherein the field programmable gate array is configured to:

simultaneously obtain multiple samples of multiple input signals to be amplified; and simultaneously pre-distort at least some of the samples for each of the input signals.

21. The system of claim 15, wherein the at least one lookup table contains one-to-one or many-to-one mappings of one or more characteristics of input signal samples to pre-distortion values.

* * * * *